US006952121B1

(12) United States Patent
Vu

(10) Patent No.: US 6,952,121 B1
(45) Date of Patent: Oct. 4, 2005

(54) PRESCALING FOR DIVIDING FAST PULSED SIGNAL

(75) Inventor: Ha C. Vu, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/717,955

(22) Filed: Nov. 20, 2003

(51) Int. Cl.[7] ................................................ H03K 21/00

(52) U.S. Cl. ....................... 327/115; 327/117; 327/151; 377/52; 377/118

(58) Field of Search ................................ 327/115, 117, 327/118, 150, 145–148, 151, 156, 160; 332/126; 377/118, 47, 48, 52

(56) References Cited

U.S. PATENT DOCUMENTS 4,184,068 A * 1/1980 Washburn .................... 377/44
4,325,031 A * 4/1982 Ooms et al. ................ 331/1 A
4,575,867 A * 3/1986 Hogue ........................ 377/110
RE32,605 E * 2/1988 Yamashita et al. ............ 377/47
4,991,187 A * 2/1991 Herold et al. ................. 377/48
5,084,907 A * 1/1992 Maemura ..................... 377/48
5,202,906 A * 4/1993 Saito et al. ................... 331/14
5,534,821 A * 7/1996 Akiyama et al. .............. 331/8
5,572,168 A * 11/1996 Kasturia ........................ 331/2
5,818,293 A * 10/1998 Brehmer et al. ............ 327/202
5,841,302 A * 11/1998 Ishii et al. .................. 327/117
5,859,890 A * 1/1999 Shurboff et al. .............. 377/48
5,867,068 A * 2/1999 Keating ....................... 377/48
5,878,101 A * 3/1999 Aisaka ........................ 377/47
5,892,405 A * 4/1999 Kamikubo et al. ........... 331/14
5,982,840 A * 11/1999 Aisaka .......................... 377/2
6,097,782 A * 8/2000 Foroudi ....................... 377/47
6,163,181 A * 12/2000 Nishiyama ................... 377/47
6,385,276 B1 * 5/2002 Hunt et al. ................... 377/47
6,559,726 B1 * 5/2003 Stansell ....................... 331/16
6,603,360 B2 * 8/2003 Kim et al. .................... 331/16
6,737,899 B2 * 5/2004 Sudjian ...................... 327/208

OTHER PUBLICATIONS

Marie, Herve, et al. "R, G, B Acquisition Interface with Line–Locked Clock Generator for Flat Panel Display", IEEE Journal of Solid–State Circuits, vol. 33, No. 7, Jul. 1998, pp. 1009–1013.

Marie, Herve, et al. "Correction to R, G, B Acquisition Interface with Line–Locked Clock Generator for Flat Panel Display", IEEE Journal of Solid–State Circuits, vol. 35, No. 8, Aug. 2000, pp. 1253.

B. Razavi, RF Microelectronics, Prentice Hall Communications Engineering and Emerging Technologies Series, Chapter 8, pp. 270–271, 1997.

* cited by examiner

*Primary Examiner*—Timothy P. Callahan
*Assistant Examiner*—Hai L. Nguyen
(74) *Attorney, Agent, or Firm*—Darby & Darby P.C.; Matthew M. Gaffney

(57) ABSTRACT

Circuits, devices and methods are provided for dividing a fast pulse signal by an integer M. A dual modulus prescaler receives input pulses, counts them, and generates one prescaled pulse for every Qth input pulse. Q is a division modulus, and has a different value depending on a modulus control signal. When the prescaler generates a prescaled pulse from an input pulse, it ignores the modulus control signal at least until the onset of a next input pulse. A program counter generates a reset signal when the prescaler receives the Mth input pulse. A swallow counter then changes the modulus control signal to a different value, and the prescaler starts dividing by a different modulus. Even if the prescaler had already received the onset of the next input pulse, it accounts for it properly, for dividing with the different modulus.

18 Claims, 11 Drawing Sheets

500

M = N*P + S

FOR N=4

| M | DIV ← M-1 | P ← DIV[11:2] | S ← DIV[1:0] |
|---|---|---|---|
| (12 bit) | (12 bit) | (10 bit ) | (2 bit ) |
| | | | |
| (values) | | (values) | (values) |
| 17-20 | ... | 4 | 0-3 |
| 21-24 | | 5 | 0-3 |
| 25-28 | | 6 | 0-3 |
| 29-32 | | 7 | 0-3 |
| 33-36 | | 8 | 0-3 |
| 37-40 | | 9 | 0-3 |
| ... | | ... | |
| 1009-1013 | | 252 | 0-3 |
| ... | | ... | |
| 2033-2036 | | 508 | 0-3 |
| ... | | ... | |
| 3072-3076 | | 768 | 0-3 |
| ... | | ... | |
| 4093-4096 | | 1023 | 0-3 |

| VARIABLE TYPE | SYMBOL | START (AT POR) | NEXT ASSIGNED VALUE |
|---|---|---|---|
| INTERNAL | D2 | 1 | NEXT_D2 = DIV4 OR D0 |
| INTERNAL | D1 | 1 | NEXT_D1 = ~ (D2 AND D0) |
| INTERNAL | D0 | 1 | NEXT_D0 = D1 |
| OUTPUT | CK45 | 1 | NEXT_CL45 = D2 AND D1 AND D0 |

PRESCALER LOGIC

XX = DON'T CARE

Figure 7

PRESCALING FOR DIVIDING FAST PULSED SIGNAL

FIELD OF THE INVENTION

The present invention is related to the field of electrical circuits, and more specifically to electrical circuits, devices, and methods for prescaling to divide a fast pulsed signal, such as a fast clock.

BACKGROUND

It is often desired to have circuits with very fast internal clocks. These are used in applications such as driving the pixels of a display. Generating such clocks often requires that they be divided back, so that their frequency can be defined via a Phase Locked Loop (PLL).

BRIEF DESCRIPTION OF THE DRAWINGS

The invention will become more readily apparent from the following Detailed Description, which proceeds with reference to the accompanying drawings, in which:

FIG. 5 illustrates a table of possible values of M, and how they are attainable by components of the counter circuit of FIG. 3;

FIG. 7 illustrates a table of logical instructions of a prescaler that can divide a fast input pulsed signal;

DETAILED DESCRIPTION

Figure 1:
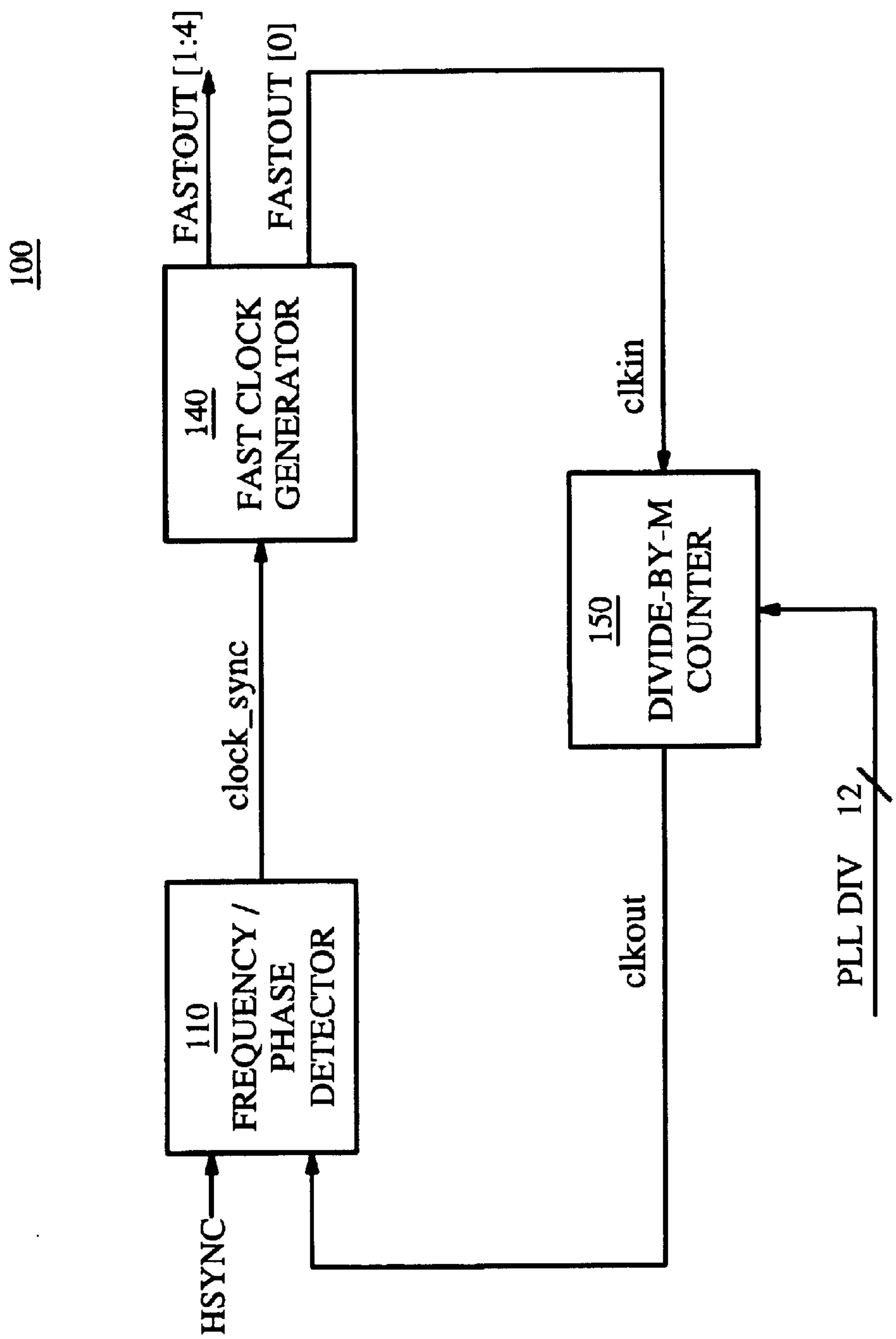
FIG. 1 illustrates a block diagram of components of a circuit for generating a fast clock.

The present invention is now described. While it is disclosed in its preferred form, the specific embodiments of the invention as disclosed herein and illustrated in the drawings are not to be considered in a limiting sense. Rather, these embodiments are provided so that this disclosure will be thorough and complete, and will fully convey the scope of the invention to those skilled in the art. Indeed, it should be readily apparent in view of the present description that the invention may be modified in numerous ways. Among other things, the present invention may be embodied as devices, methods, software, and so on. Accordingly, the present invention may take the form of an entirely hardware embodiment, an entirely software embodiment or an embodiment combining software and hardware aspects. The following detailed description is, therefore, not to be taken in a limiting sense.

Throughout the specification, the meaning of "a," "an," and "the" may also include plural references. The meaning of "in" includes "in" and "on." The term "coupled" means a direct connection between the items that are connected, or an indirect connection through one or more intermediary devices or components. The term "pulse" includes a pulse whose waveform may or may not be rectangular from a baseline signal.

Briefly, the present invention provides circuits, devices and methods for dividing a fast pulse signal by an integer M. In an embodiment, a circuit generates a fast clock signal, which is divided by M to provide a clock sync feedback.

In some embodiments, a dual modulus prescaler is arranged to receive periodic input pulses. The prescaler then counts the received input pulses, and generates one prescaled pulse for every Qth input pulse. Q is a division modulus, and has a different value depending on a modulus control signal. When the prescaler generates a prescaled pulse from an input pulse, it then ignores the modulus control signal at least until the onset of a next input pulse, and sometimes until the onset of one more input pulse. A program counter generates a reset signal when the prescaler receives the Mth pulse. A swallow counter then changes the modulus control signal to a different value. Accordingly, the prescaler starts dividing by a different division integer. Even if the modulus control signal changes after the prescaler has already received the onset of the next one or two input pulses, the prescaler accounts for them properly, for dividing with the different division integer.

The invention offers the advantage that a fast pulse input signal can be used, and thus a faster clock can be generated with little additional change. There is no limitation that the period of the input pulses must be longer than how long it takes for the modulus control signal to be changed due to the reset signal.

The invention is now described in more detail.

FIG. 1 illustrates a block diagram of some components of a circuit 100 in which the invention may be embodied. Circuit 100 generates a fast clock signal FASTOUT from a reference synchronization signal HSYNC which has a reference frequency fclkref. In addition to possibly other components, circuit 100 includes frequency/phase detector 110, which receives signal HSYNC and outputs a synchronized signal clock_sync. A fast clock generator 140 generates a fast clock signal FASTOUT from synchronized signal clock-sync. Fast clock signal FASTOUT may have a number of outputs, for example for further providing signals having different phases of a clock. A Divide-by-M counter 150 receives fast clock signal FASTOUT, and may treat it as an input pulsed signal clkin. Counter 150 also receives a counter control signal PLLDIV, which is used to select the number M by programming. Counter 150 outputs a divided down signal clkout, which includes one pulse for every M pulses of input signal clkin. Frequency/phase detector 110 compares the divided down signal clkout with signal HSYNC, to generate the synchronized clock sync signal.

Figure 2:
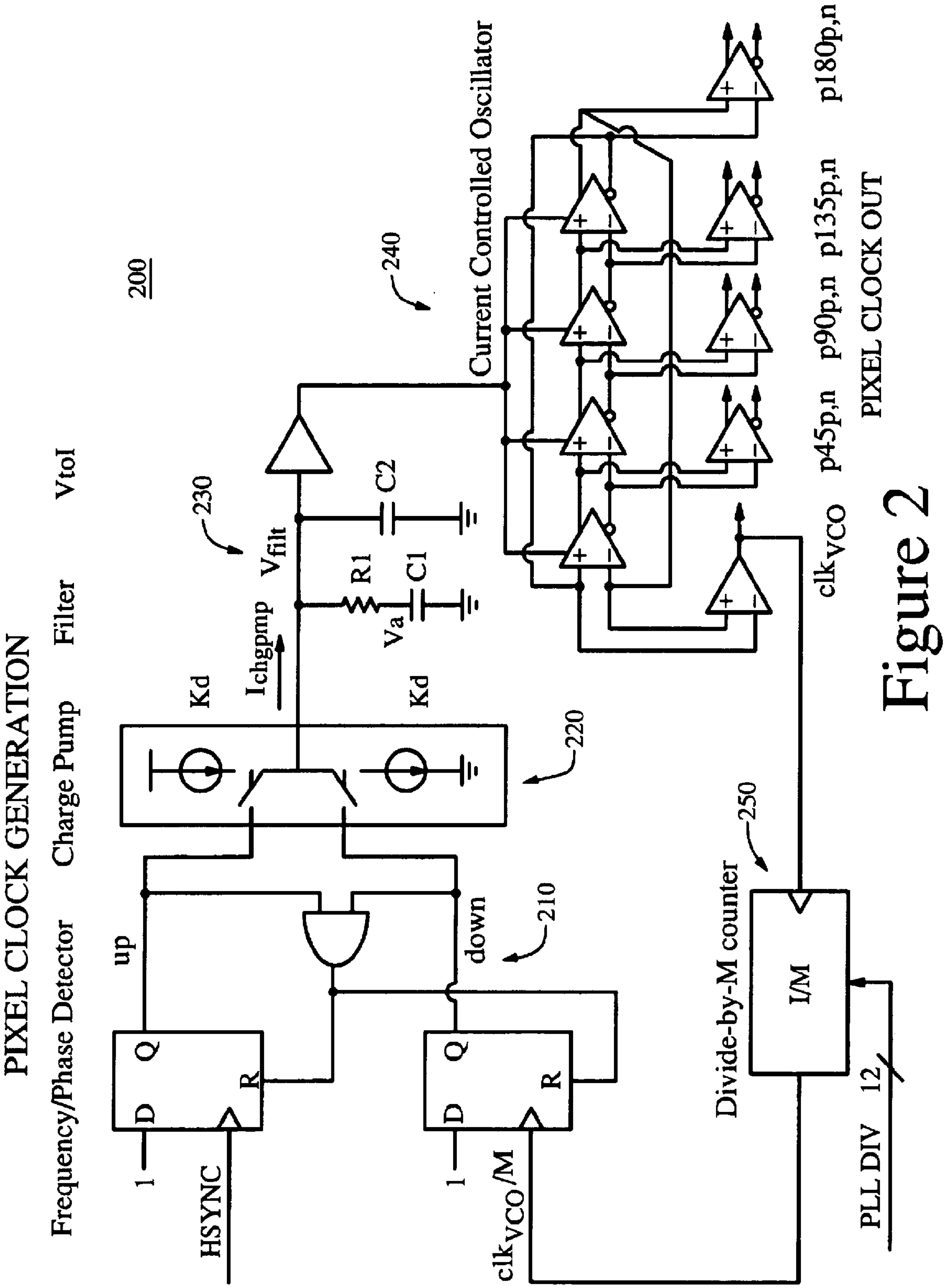
FIG. 2 illustrates a sample schematic diagram of a circuit for implementing the circuit of FIG. 1.

FIG. 2 illustrates a sample schematic diagram of a circuit 200 for implementing circuit 100. A frequency/phase detector 210 receives synchronization signal HSYNC and a divided down signal $clk_{VCO}/M$. Detector 210 compares these two signals, and generates an output that is directed to a charge pump 220, whose output is in turn directed to a filter 230. An output of filter 230 is directed to a fast clock generator 240, which is made from a voltage to current converter and a current controlled oscillator. Fast clock generator 240 outputs four phases for generating, for example, a pixel clock for a flat panel display. One more output carries fast clock signal $clk_{vco}$, which may be just one more of the signals encoding a clock phase. A divide-by-M counter 250 receives fast clock signal $clk_{VCO}$, and generates divided down signal $clk_{VCO}$/M.

In both FIG. 1 and FIG. 2, the result is that fast clock signal FASTOUT has a frequency fclkout given by M*fclkref. Both circuits operate as a Phased Locked Loop (PLL). A display oftentimes needs a pixel clock with a frequency range between 25 MHz and 205 MHz. If signal HSYNC is provided with a frequency between 31 kHz and 106 kHz, then a 12-bit Programmable Frequency Divider is employed for divide-by-M counters 150, 250. A 12-bit divider presents a challenge to a 0.35$\mu$ CMOS technology. The whole frequency divider must work fast, but limitations in the speed of the 12-bit divider in turn limit how fast the clock can be. Such counters are sometimes implemented by pulse-swallow dividers, such as described below.

Figure 3:
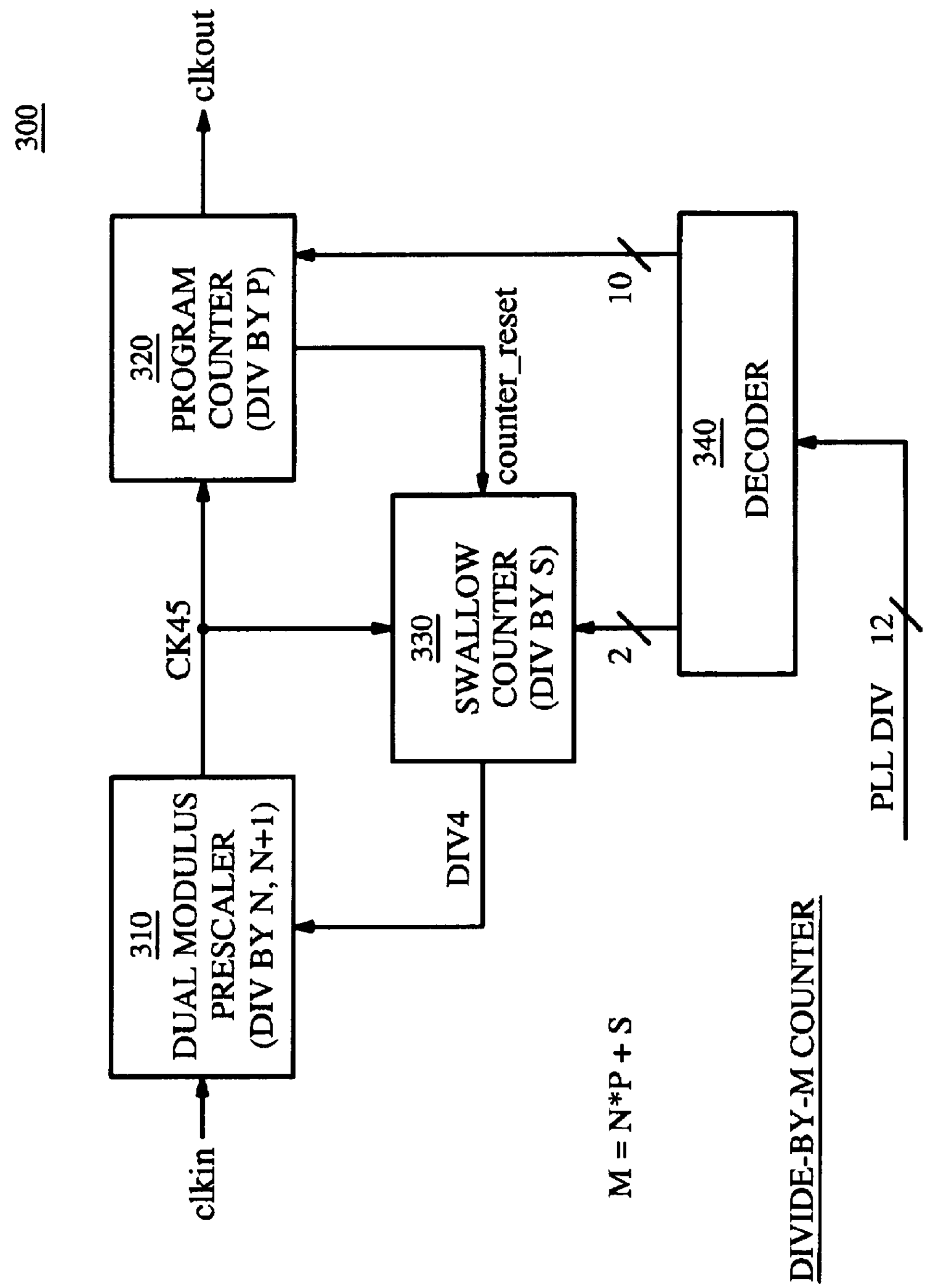
FIG. 3 illustrates a block diagram of a DIVIDE-BY-M counter circuit, such as that of FIG. 1.

FIG. 3 illustrates a block diagram of a divide-by-M counter circuit 300, which may also be used for divide-by-M counter circuit 150 of FIG. 1. Circuit 300 belongs in the pulse-swallow divider category of divide-by-M counters. Circuit 300 includes a dual modulus prescaler 310, a program counter 320, a swallow counter 330, and a decoder 340, which are coupled to each other as shown.

Figure 4A:
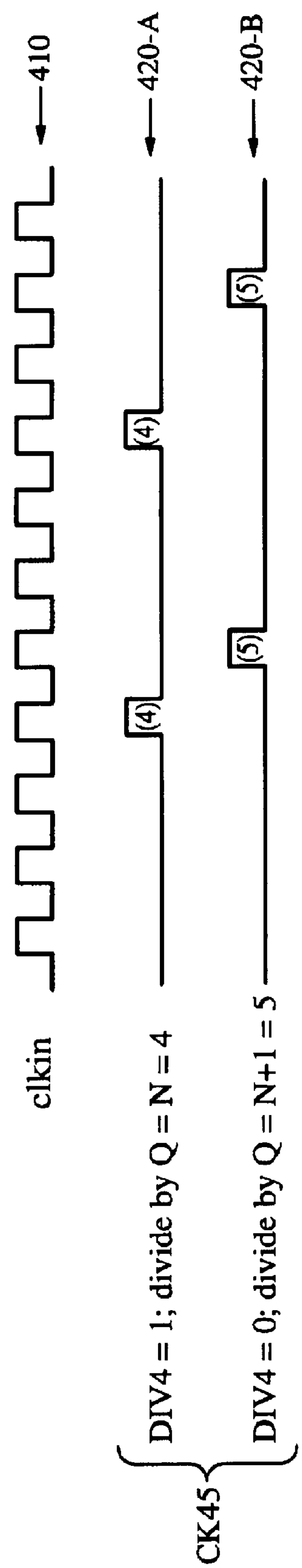
FIG. 4A illustrates timing diagrams for showing behaviors of a dual modulus prescaler of FIG. 3 for different values of a modulus control signal.

Referring now also to FIG. 4A, dual modulus prescaler 310 receives periodic input pulses clkin having a waveform 410, and generates signal CK45 that includes prescaled pulses having one of waveforms 420-A and 420-B. One prescaled pulse is generated for every Qth input pulse, where Q is the modulus of division at the moment. Q is an integer with a value depending on the value of modulus control signal DIV4 at the moment. Q may assume more than one values during operations, for example it can have different moduli Q(1) and Q(2). In some embodiments, Q(1)=N and Q(2)=N+1. The embodiments described from this point on are for Q(1)=N=4 and Q(2)=N+1=5, but that is only by way of example, and not of limitation. In FIG. 4A, waveform 420-A shows the case where there is one prescaled pulse for every 4 input pulses, and waveform 420-B shows the case where there is one prescaled pulse for every 5 input pulses.

Returning to FIG. 3, program counter 320 and swallow counter 330 are primarily counter-dividers, dividing by P and S respectively. P and S are division moduli, except they need not change during operation. Their value, along with N of prescaler 310, determines the ultimate number M, as will also be seen below. Signal CK45 is received by both program counter 320 and swallow counter 330. This permits them to operate at a lower frequency, instead of that of input pulses clkin. Every time prescaler 310 receives an Mth pulse, program counter 320 issues a counter_reset signal to swallow counter 330. Swallow counter S outputs the modulus control signal DIV4, and changes it twice for every M input pulses. The second time is also on occasion of the counter_reset signal.

Figure 4B:
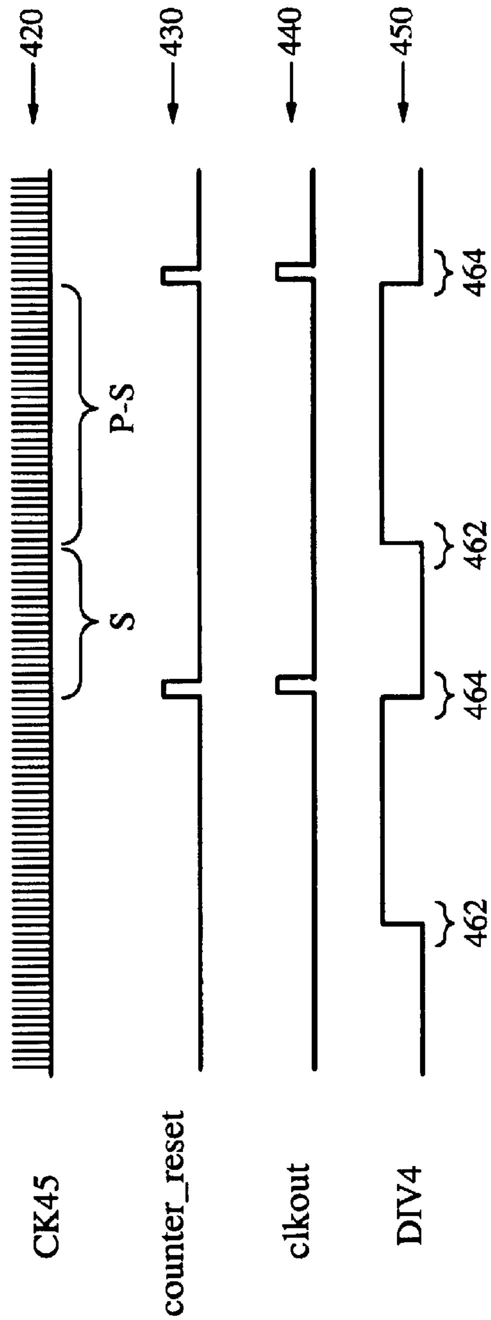
FIG. 4B illustrates timing diagrams of signals generated by components of the circuit of FIG. 3.

Referring now also to FIG. 4B, every time signal CK45 (waveform 420) corresponds to M input pulses, there is one counter_reset pulse (waveform 430), and one clkout pulse (waveform 440). In addition, modulus control signal DIV4 (waveform 450) changes twice during the cycle. Waveform 450 changes to a value of 1 in neighborhoods 462, and back to a value of 0 in neighborhoods 464.

As seen also above with reference to FIG. 4A, the state of modulus control signal DIV4 (0 or 1) determines whether prescaler 310 divides by 4 or by 5. Since modulus Q alternates within FIG. 4B, waveform 420 includes segments of both waveform 420-A and waveform 420-B. Accordingly, the density of prescaled pulses in waveform 420 of FIG. 4B varies. More particularly, there are S prescaled pulses when there is division by N+1, and P−S prescaled pulses when there is division by N. Therefore, one complete cycle that includes M input pulses is accomplished for every S*(N+1)+(P−S)*N=P*N+S prescaled pulses. Therefore, M=P*N+S.

Returning to FIG. 3, decoder 340 receives signal PLLDIV, decodes it, and uses it to program the values of P, S into program counter 320 and swallow counter 330 respectively. This way, M becomes programmed externally into circuit 300. This is performed as follows.

Referring now also to FIG. 5, the desired ratio M is programmed as follows. Assuming N=4, from the 12 bit value of M a new variable DIV=M−1 is determined. The 12 bits of variable DIV are used as the bits of signal PLLDIV. From variable DIV, the 10 most significant bits are used to program P, and the 2 least significant bits are used to program S. Table 500 also shows the values of M, P and S through this process.

Figure 6:
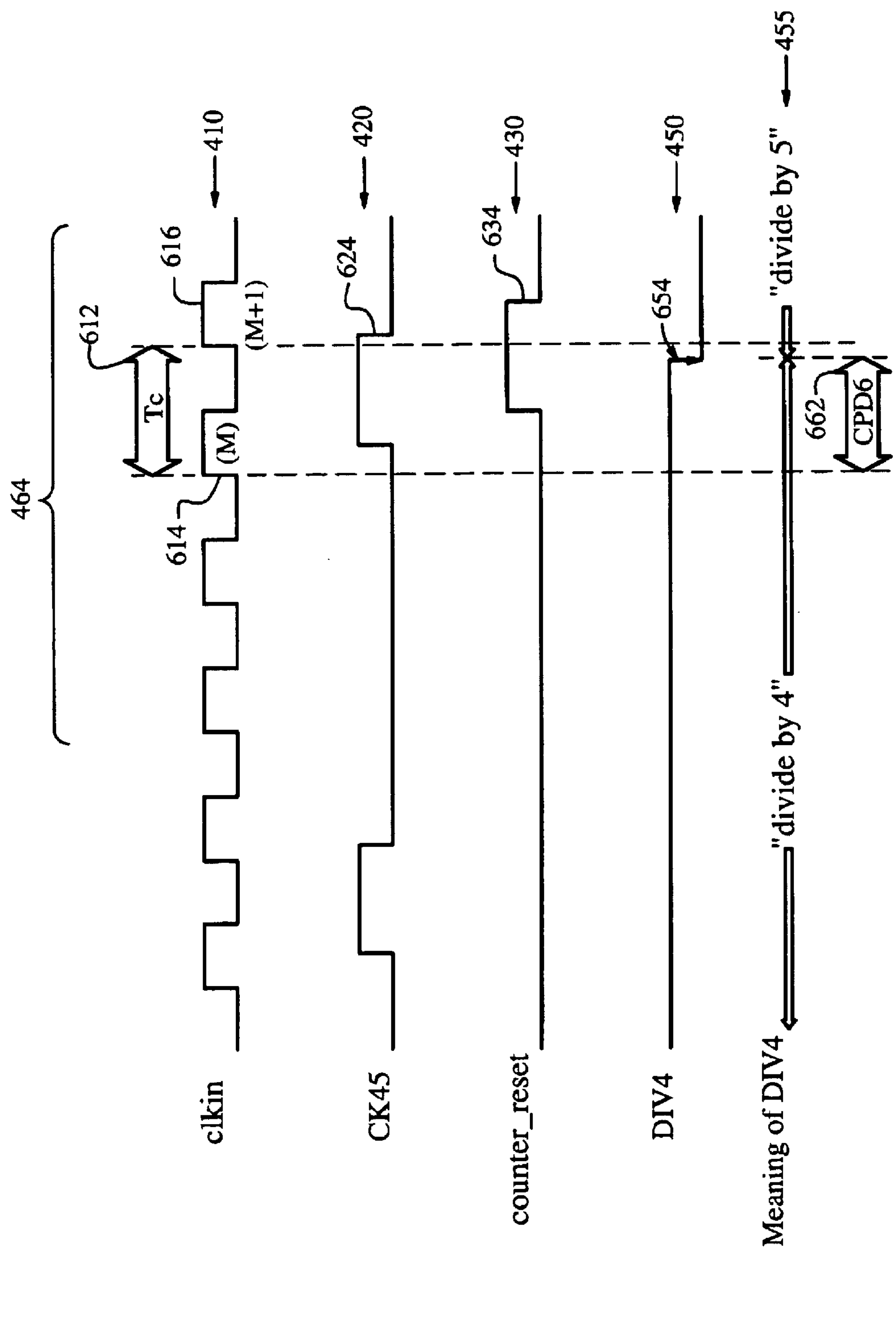
FIG. 6 illustrates a time expanded detail of the timing diagrams of FIGS. 4A and 4B, to illustrate a critical path delay limitation.

Referring now to FIG. 6, the arising limitation in clock speed occurs from what happens in neighborhoods 464 of FIG. 4B. Some of the waveforms of FIG. 4B are repeated, but in an expanded time scale for clarity. Input pulsed signal clkin has a period Tc illustrated by arrow 612. It also has an Mth pulse 614, which generates transitions, and then a next pulse 616. Pulse 616 ought to be counted and divided with the next group of pulses, for forming a prescaled pulse.

Signal CK45 has prescaled pulse 624 in waveform 420, caused by Mth pulse 614 in waveform 410. Counter_reset signal 430 includes a pulse 634, caused by prescaled pulse 624 in waveform 420. Modulus control signal DIV4 450 includes a change 654 from 1 to 0, caused by pulse 634. The meaning of that is shown in diagram 455, where the instruction "divide by 4" changes to "divide by 5".

There is a critical path delay CPD6 662 from the onset of Mth pulse 614 to change 654, which is caused by the delay of the components in reacting to new signals. The delay forces design such that period Tc of input pulsed signal clkin (waveform 410) is maintained longer than CPD6 662, so that when next input pulse 616 is received, modulus control signal DIV4 will have reached its final value. This delay limits the speed of input pulses 410, and thus the frequency of the generated clock.

As will be explained in more detail below, the invention includes a prescaler that has at least two moduli, and internal arrangement that avoids this problem. In a prescaler according to the invention, when a prescaled pulse is generated from a selected input pulse, the modulus control signal is ignored at least until the onset of a next input pulse is received. Ignoring takes place irrespectively of the period of the input pulses. Regardless, even if the ignored modulus control signal acquires a different value due to the input pulse, the next pulse is counted according to a correspondingly different value of the modulus of the prescaler.

Ignoring the modulus control signal is performed according to one of at least three ways according to the invention. In some embodiments, the modulus control signal is latched for one input pulse cycle, so a change of it does not become known. In other embodiments, the modulus control signal is substituted by a forced value for that input cycle.

In yet other embodiments, the prescaler is made from components that define state variables. In some of these instances, the components output signals that encode the state variables. The components may be logical circuits, and the state variables may be binary, such as one or zero. In some of these embodiments, the state variables are initialized to particular values when a prescaled pulse is generated. These embodiments exploit the fact that the modulus control signal has a known value at that time. In the examples described in this document, N=4, and the value of DIV4 changes from one to zero. The modulus control signal is ORed with another signal that has an initialized value of one, and thus the change of the modulus control signal does not matter, while the next input pulse is properly accounted for. In some of these embodiments, the state variables become initialized to the particular values also when a Power On Reset is performed. Particular examples are described below.

FIG. 7 illustrates a table 700 of logical instructions of a prescaler that can divide accelerated input pulses, for an embodiment of the invention where N=4. Three internal state variables include D2, D1, D0, and can be thought of as a vector. They are all initialized with a value of one. They are updated by computing their next assigned values, in terms of variables next_D2, next D1, and next_D0 from the previous set of their values. Their next assigned values defines the updated state vector. And a prescaled pulse (of signal CK45) may be generated by ANDing D2 and D1 and D0.

Figure 8:
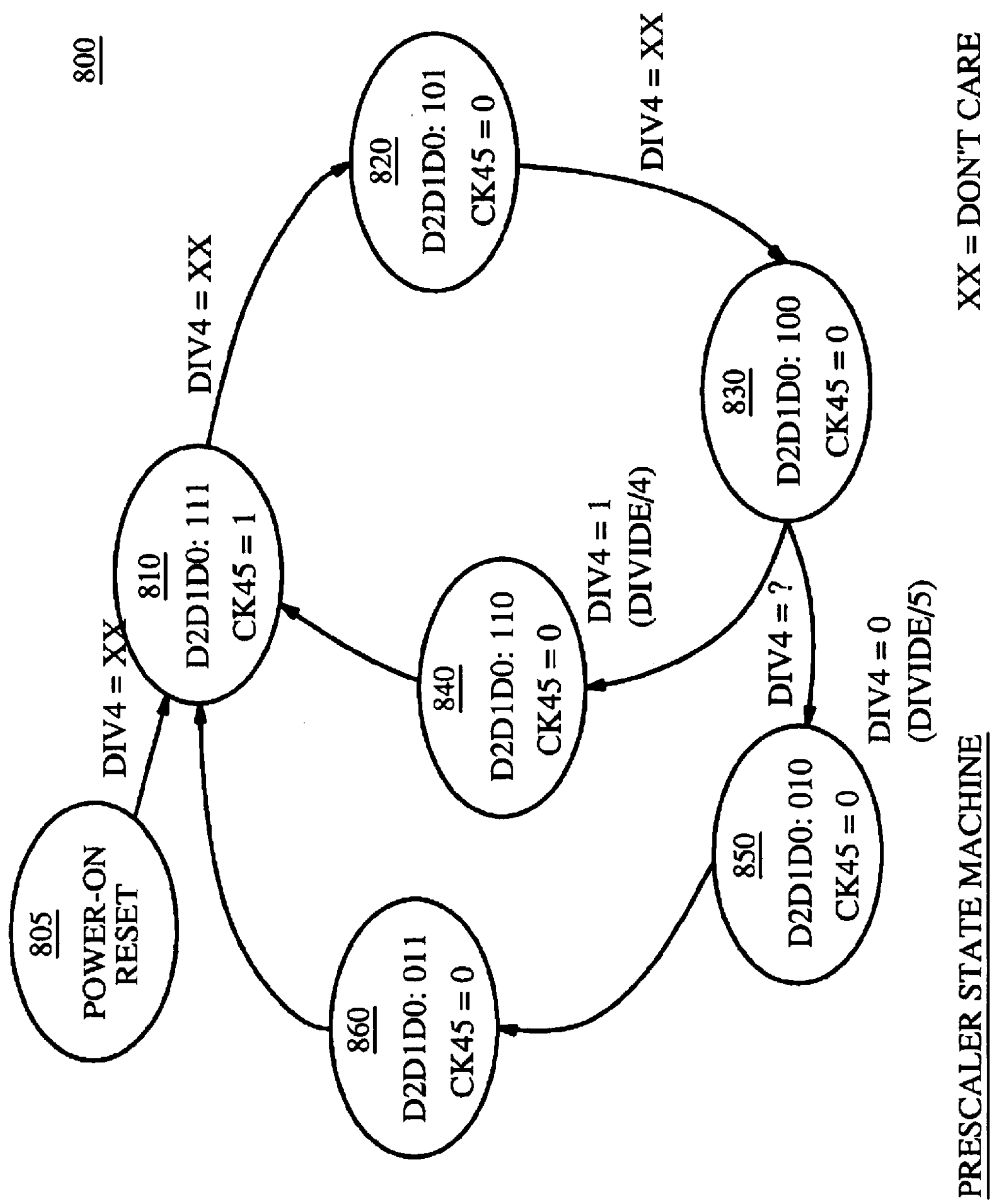
FIG. 8 illustrates a diagram of a state machine of a prescaler that follows the logical instructions of FIG. 7.

FIG. 8 illustrates a diagram of a state machine of a prescaler that follows the logical instructions of FIG. 7. State 810 represents both the initialized state, and also the resulting one that generates a prescaled pulse after Q input pulses. In one embodiment, Power On Reset (state 805) also takes to state 810.

After state 810, the next input pulse takes to state 820, and one more input pulse takes to state 830. It should be observed that for reaching both states 820 and 830 the value of DIV4 does not matter ("XX=DON'T CARE"), because it is ORed with state variable D0, which is one. This way, even if modulus control signal DIV4 changes (e.g. due to a very fast input clock), the operation will not be affected.

At state 830, it is inquired for the first time what is the value of DIV4. If the value is 1, then it takes two more states (840, then 810 again), for a total of N=4, to accomplish division by four. If at state 830 DIV4 is found to be 0, then it takes three more states (850, then 860, then 810 again), for a total of N+1=5, to accomplish division by five.

Figure 9:
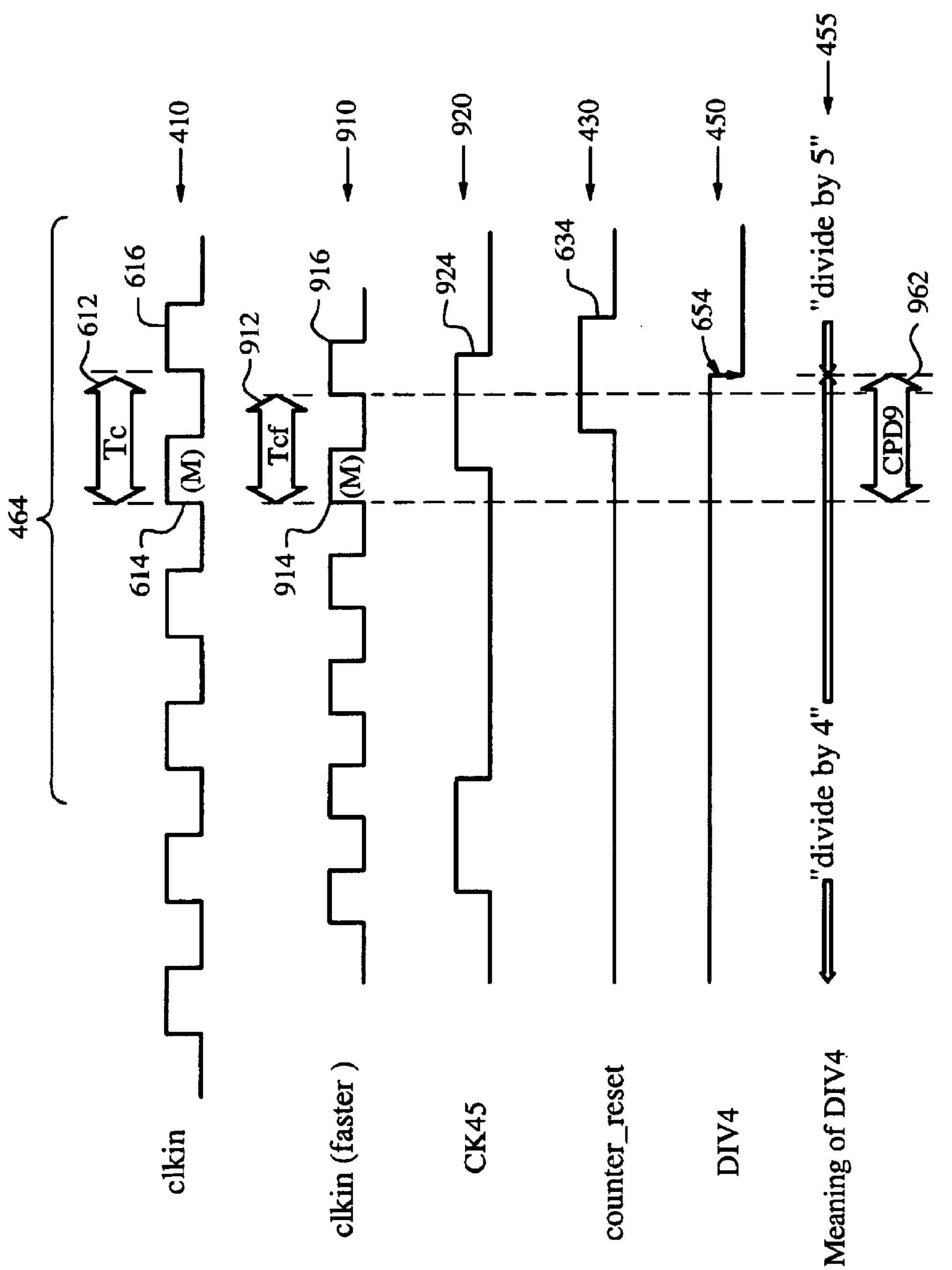
FIG. 9 illustrates timing diagrams of signals resulting from a prescaler that follows the logical instructions of FIG. 7.

FIG. 9 illustrates timing diagrams of signals resulting from a prescaler that follows the logical instructions of FIG. 7. In addition, waveform 410 is repeated from FIG. 6, for reference only.

A faster input clkin waveform 910 may be received, which has a period Tcf 912 shorter than-period Tc 612 of waveform 410. It can be appreciated that waveform 910 is shown with the same number of pulses as the earlier clock 410, but requires less time (measured on the horizontal time axis), because it is faster, as enabled by the invention.

Pulse 914 of waveform 910 is the Mth pulse, and pulse 916 is the next pulse. Much of the behavior is similar to what is described in FIG. 6. In other words, a prescaled pulse 924 is generated in CK45 waveform 920, in response to input pulse 914. Pulse 924, however, is generated by the instructions of FIG. 7, and changing from state 840 to state 810 in FIG. 8. A counter_reset pulse 634 is generated in response to prescaled pulse 924, and a change 654 is generated in response to counter-reset pulse 634. A critical path delay CPD9 962 is exhibited, which may be the same as critical path delay CPD6 662 of FIG. 6. It should be noted that critical path delay CPD9 962 is shorter than the faster clock period Tcf 912.

FIG. 9 illustrates concurrently this important advantage of the invention. When the prescaler receives Mth pulse 914, modulus control signal DIV 4 changes value after the prescaler has already received the onset of next input pulse 916. Thus, clocks of higher frequencies may be used. The full advantage comes from exploiting the fact that, for N=4 and the particular states of FIG. 8, the prescaler is indifferent to modulus control signal DIV 4 for the two next input pulses, not just one. A correspondingly faster input pulse waveform can thus be used by the invention.

Figure 10:
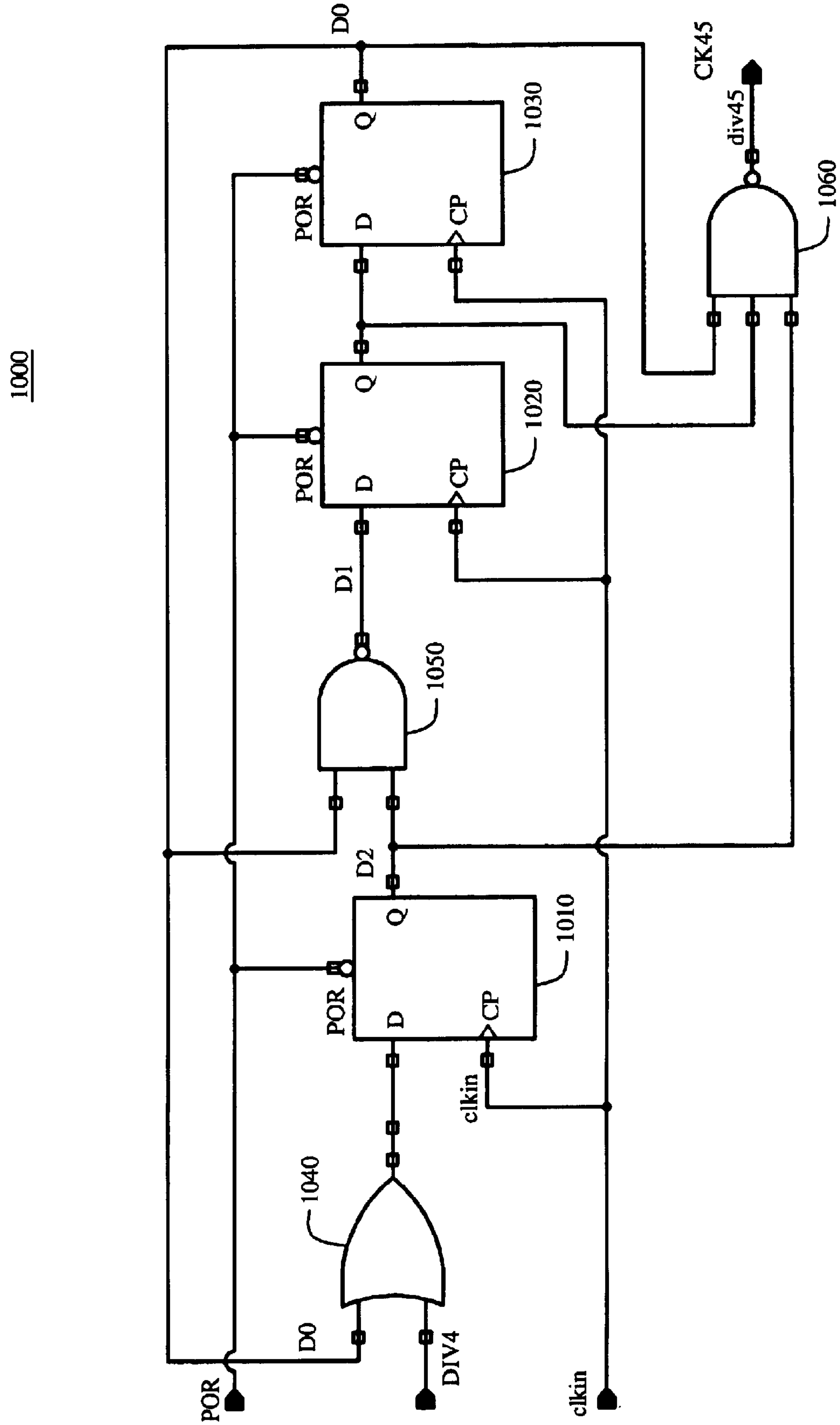
FIG. 10 illustrates a sample schematic diagram of a prescaler that follows the logical instructions of FIG. 7.

FIG. 10 illustrates a sample schematic diagram of a prescaler 1000 that follows the logical instructions of FIG. 7. Three latches 1010, 1020, 1030 respectively produce signals D2, D1, D0, whose values are respective state variables D2, D1, D0. Prescaler 1000 includes an OR gate 1040 for ORing modulus control signal DIV 4 with signal D0. It also includes a NAND gate 1050 nor negative ANDing D2 and D0. Finally, it includes a three input AND gate 1060, for ANDing D2, D1 and D0 to produce signal CK45.

Figure 11:
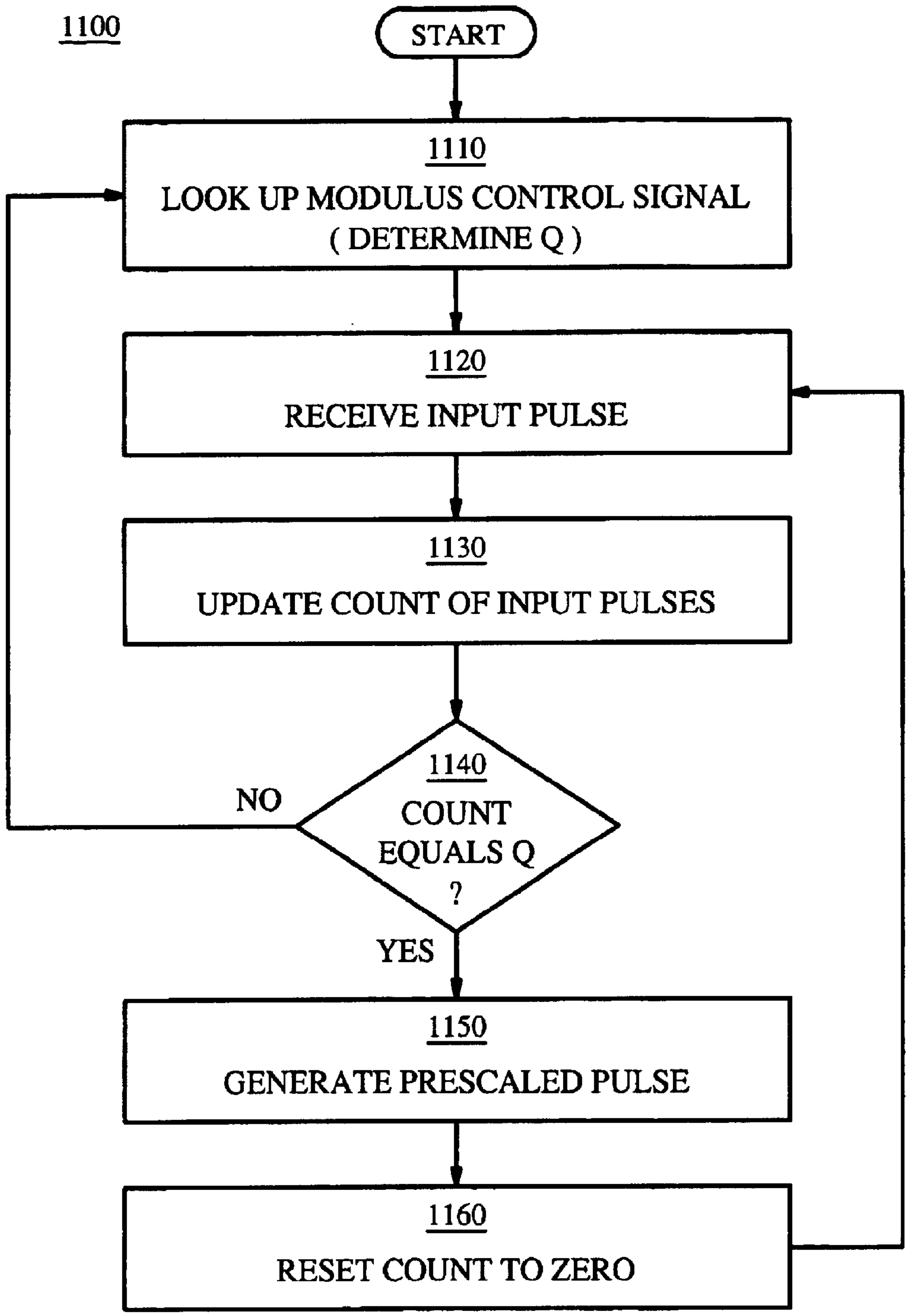
FIG. 11 illustrates a flowchart for describing a method according to an embodiment of the present invention.

FIG. 11 illustrates a flowchart 1100 for describing a method according to an embodiment of the invention. The method of flowchart 1100 may also be practiced by different embodiments of the invention, including but not limited to a prescaler that follows the instructions of FIG. 7.

Moving from a start block, the process advances to a block 1110, where a modulus control signal is looked up. This determines the value of modulus Q of the moment. At a next block 1120, an input pulse is received. At a next block 1130, a count of input pulses is updated. At optional next block 1140, it is determined whether the count equals Q. If not, then execution returns to block 1110, to ultimately receive another input pulse.

If at block 1140 the count of input pulses equals Q, then at a next block 1150, a prescaled pulse is generated. Then at a next block 1160, the count is reset to zero, and execution returns to block 1120. This way another input pulse is received and counted, but by skipping block 1110. Accordingly, even if the modulus control signal has changed, and therefore Q has changed, it does not become known for at least one cycle.

Additionally, a divided down signal can be generated in response to the prescaler receiving the Mth pulse. Also, a synchronized signal can be generated in response to the divided down signal. Furthermore, a fast clock signal can be generated in response to the synchronized signal, and the input periodic pulses can be derived from the fast clock signal.

Numerous details have been set forth in this description, which is to be taken as a whole, to provide a more thorough understanding of the invention. In other instances, well-known features have not been described in detail, so as to not obscure unnecessarily the invention.

The invention includes combinations and subcombinations of the various elements, features, functions and/or properties disclosed herein. The following claims define certain combinations and subcombinations, which are regarded as novel and non-obvious. Additional claims for other combinations and subcombinations of features, functions, elements and/or properties may be presented in this or a related document.

What is claimed is:

1. A circuit for dividing periodic input pulses by a preset integer M, comprising:

a dual modulus prescaler arranged to receive periodic input pulses and to count the received input pulses for generating prescaled pulses, wherein one prescaled pulse is generated for every Qth input pulse, wherein Q is a division modulus having a value depending on a value of a modulus control signal, wherein when a prescaled pulse is generated from a selected input pulse, the modulus control signal is ignored at least until the onset of a next input pulse is received;

a swallow counter arranged to change the modulus control signal to a different value in response to the prescaler receiving every Mth input pulse, wherein M is a preset integer; and a program counter to generate a reset signal in response to the prescaler receiving the Mth input pulse, and wherein the swallow counter changes the modulus control signal in response to the reset signal.

2. The circuit of claim 1, wherein if the ignored modulus control signal acquires a different value due to the selected input pulse, the next pulse is counted according to a correspondingly different value of Q.

3. The circuit of claim 2, wherein when the prescaler receives a selected one of the Mth pulses, the modulus control signal changes value after the prescaler has already received the onset of a next input pulse.

4. The circuit of claim 1, wherein the prescaler includes an OR gate for ORing the modulus control signal with another signal.

5. The circuit of claim 1, further comprising:

a frequency/phase detector arranged to receive a divided down signal generated in response to the prescaler receiving the Mth input pulse, and to output a synchronized signal in response to the divided down signal; and a fast clock generator to generate a fast clock signal from the synchronized signal, and wherein the input pulses are derived from the fast clock signal.

6. The circuit of claim 1, wherein the program counter is adapted to generate the reset signal in response to receiving a prescaled pulse that corresponds to the prescaler receiving the Mth input pulse.

7. The circuit of claim 6, wherein the prescaler includes components that define state variables which are initialized to particular values when a prescaled pulse is generated, and the state variables become initialized to the particular values also when a Power On Reset is performed.

8. A device comprising:

means for receiving periodic input pulses; and means for counting the received input pulses to generate prescaled pulses, wherein one prescaled pulse is generated for every Qth input pulse, wherein Q is a division modulus having a value depending on a value of a modulus control signal, and when a prescaled pulse is generated from a selected input pulse, the modulus control signal is ignored at least until the onset of a next input pulse following the selected input pulse is received; and a means for generating a reset signal in response to the prescaler receiving the Mth input pulse, wherein M is a preset integer, and wherein a swallow counter changes the modulus control signal in response to a reset signal.

9. A method comprising:

receiving periodic input pulses; and counting the received input pulses to generate prescaled pulses, wherein one prescaled pulse is generated for every Qth input pulse, wherein Q is a division modulus having a value depending on a value of a modulus control signal, when the prescaled pulse is generated from a selected input pulse, the modulus control signal is ignored at least until the onset of a next input pulse following the selected input pulse is received; and generating the prescaled pulses includes:

initializing a vector of state variables when the prescaled pulse is generated, and updating the vector during the next input pulse in a way that is indifferent to the updated modulus control signal.

10. The method of claim 9, wherein the modulus control signal is further ignored at least until the onset of a second next input pulse following the next input pulse is received.

11. The method of claim 9, wherein if the ignored modulus control signal acquires a different value due to the selected input pulse, the next pulse is counted according to a correspondingly different value of Q.

12. The method of claim 9, wherein the first value of Q equals a preset number N, and the second value of Q equals N+1.

13. The method of claim 9, wherein when the prescaler receives an Mth one of the input pulses, the modulus control signal changes value after the prescaler has already received the onset of the next input pulse, wherein M is a preset integer.

14. The method of claim 13, further comprising:

generating a divided down signal in response to the prescaler receiving the Mth input pulse;

generating a synchronized signal in response to the divided down signal; and generating a fast clock signal in response to the synchronized signal, and wherein the input periodic pulses are derived from the fast clock signal.

15. The method of claim 9, wherein the state variables are encoded in signals generated by logical devices.

16. The method of claim 9, wherein a selected one of the state variables is set equal to one at initialization, and the modulus control signal is ORed with the signal encoding the selected state variable.

17. The method of claim 9, wherein if a Power On Reset is performed, the state variables are also initialized to the same states as when a prescaled pulse is generated.

18. The method of claim 9, wherein the vector is made at least from state variables D2, D1, D0, each of the state variables D2, D1, D0 is initialized with a value of one, and updating the vector further includes:

generating a next D2 value derived by ORing the values of D0 and that of the modulus control signal, generating a next D1 value derived by negative AND-ing the values of D2 and D0, generating a next D0 value derived by the value of D1, and then using the next D2 value, next D1 value and next D0 value for updating the vector.

* * * * *

UNITED STATES PATENT AND TRADEMARK OFFICE

CERTIFICATE OF CORRECTION

PATENT NO. : 6,952,121 B1 Page 1 of 1

DATED : October 4, 2005

INVENTOR(S) : Ha Chu Vu

It is certified that error appears in the above-identified patent and that said Letters Patent is hereby corrected as shown below:

Column 2,
Lines 51 and 61, delete “clock-sync” and insert -- clock_sync --.

Column 6,
Line 1, delete “counter-reset” and insert -- counter_reset --.

Column 7,
Lines 12 and 63, after “until” insert -- after --.

Column 8,
Line 13, after “until” insert -- after --.

Signed and Sealed this

Tenth Day of January, 2006

JON W. DUDAS

*Director of the United States Patent and Trademark Office*